United States Patent
Kweon et al.

(10) Patent No.: US 6,210,979 B1
(45) Date of Patent: Apr. 3, 2001

(54) METHOD FOR FABRICATING FERROELECTRIC CAPACITOR IMPROVING ADHESIVE STRENGTH BETWEEN UPPER ELECTRODE AND CAPPING LAYER WITHOUT POLYMER IN FRAM DEVICE

(75) Inventors: Soon-Yong Kweon; Seung-Jin Yeom, both of Kyoungki-Do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/474,968

(22) Filed: Dec. 29, 1999

(30) Foreign Application Priority Data

Dec. 30, 1998 (KR) .................................................. 98-61170

(51) Int. Cl.⁷ .................................................... H01L 21/00
(52) U.S. Cl. .................................. 438/3; 438/6; 438/253
(58) Field of Search ............................... 438/3, 152, 241, 438/258, 266, 6, 253, 393, 396, 722; 437/32, 34, 67, 192, 200

(56) References Cited

U.S. PATENT DOCUMENTS

| | | | | |
|---|---|---|---|---|
| 5,686,323 | * | 11/1997 | Kataoka | 437/32 |
| 5,940,705 | * | 8/1999 | Lee et al. | 438/258 |
| 6,080,617 | * | 6/2000 | Fujii et al. | 438/240 |

* cited by examiner

*Primary Examiner*—David Nelms
*Assistant Examiner*—Phuc T. Dang
(74) *Attorney, Agent, or Firm*—Blakely Sokoloff Taylor & Zafman (57) ABSTRACT

Disclosed is a ferroelectric random access memory device having ferroelectric capacitors. The FRAM device according to the present invention prevents the polymer by using the TiN layer as an etching (or hard) mask and prevents the Ti atoms from being diffused into the ferroelectric layer by applying the thermal treatment to the TiN pattern on the Pt upper electrode. Furthermore, adhesive strength between the capping oxide layer and the Pt upper electrode is improved by the oxidation of the TiN pattern.

11 Claims, 7 Drawing Sheets

METHOD FOR FABRICATING FERROELECTRIC CAPACITOR IMPROVING ADHESIVE STRENGTH BETWEEN UPPER ELECTRODE AND CAPPING LAYER WITHOUT POLYMER IN FRAM DEVICE

FIELD OF THE INVENTION

The present invention relates to a semiconductor memory device and, more particularly, to a ferroelectric random access memory device having ferroelectric capacitors.

DESCRIPTION OF THE PRIOR ART

In general, a titanium (Ti) layer has been widely used for improving adhesive strength between a metal layer and an oxide layer. Also, the Ti layer has been used as a silicide layer for reducing contact resistance in a contact area of a semiconductor device. Also, a TiN layer may be used as a diffusion barrier layer for preventing silicon atoms from being diffused into the Ti layer. Accordingly, in metal wire interconnections of the semiconductor devices, the multi-layer, such as a Ti/TiN layer, is disposed under a metal layer. In the case where this multi-layer is used in connecting a Pt upper electrode of FRAM to an active region of a transistor, the Ti layer formed on the Pt upper electrode may be diffused into a ferroelectric layer through grain boundaries within the Pt layer when a high temperature treatment is carried out in following processes. Particularly, this diffusion deteriorates dielectric characteristics of the $SrBi_2Ta_2O_9$ ferroelectric layer.

On the other hand, in the case of FRAMs using Pt upper electrodes, the adhesive strength between a capping oxide layer, which protects the sidewalls of the upper and lower electrodes and the ferroelectric film, and the Pt upper electrode is reduced. So, at a cleaning process which is carried out after the formation of an interlayer insulating layer, a contact hole and a pattern of the interlayer insulating layer, a lifting may be generated.

Also, when a photoresist layer is used as an etching mask for patterning the Pt layer for the upper electrode, a fence-shaped Pt polymer may be caused and such a polymer is as thick as the photoresist layer. The residue of Pt polymers may not be removed in the following cleaning process and causes processing defects.

SUMMARY OF THE INVENTION

It is, therefore, an object of the present invention to provide an improved method for manufacturing a FRAM device.

It is another object of the present invention to provide a method for preventing Ti atoms from diffusing into a ferroelectric layer of a FRAM device.

It is still another object of the present invention to provide a method for increasing adhesive strength between a capping layer and an upper electrode in a FRAM device and preventing polymers.

In accordance with an aspect of the present invention, there is provided a method for fabricating a FRAM device, comprising the steps of: a) forming a first interlayer insulating layer on a semiconductor device having a transistor; b) forming a first conducting layer, a ferroelectric layer and a second conducting layer on the first interlayer insulating layer; c) forming a TiN layer on the second conducting layer and forming a TiN pattern layer by selectively etching the TiN layer; d) forming an upper electrode by selectively etching the second conducting layer, wherein the second conducting layer is etched using the TiN pattern layer as an etching mask; and e) forming a ferroelectric pattern layer and a lower electrode by selectively etching the ferroelectric layer and the first conducting layer.

In accordance with another aspect of the present invention, there is provided a method for fabricating a FRAM device, comprising the steps of: 1) forming a first interlayer insulating layer on a semiconductor device having a transistor; 2) forming a first conducting layer, a ferroelectric layer and a second conducting layer on the first interlayer insulating layer; 3) forming a TiN layer on the second conducting layer and forming a TiN pattern layer by selectively etching the TiN layer; 4) forming an upper electrode by selectively etching the second conducting layer, wherein the second conducting layer is etched using the TiN pattern layer as an etching mask; 5) forming a ferroelectric pattern layer and a lower electrode by selectively etching the ferroelectric layer and the first conducting layer; 6) transforming the TiN pattern layer to a Ti $O_x$ (x is 1 to 2) pattern layer by applying thermal treatment to the TiN pattern layer in an $O_2$ atmosphere; and 7) forming a protecting oxide layer covering an upper portion of the $TiO_x$ pattern layer and sidewalls of the TiOx pattern layer, the upper electrode, the ferroelectric pattern layer and the lower electrode.

BRIEF DESCRIPTION OF THE DRAWINGS

The accompanying drawings, which are included to provide a further understanding of the present invention and are incorporated in and constitute a part of this specification, illustrate embodiments of the present invention and together with the description serve to explain the concept the present invention, wherein.

DETAILED DESCRIPTION OF THE PREFERRED EMBODIMENTS

Hereinafter, a method for manufacturing a FRAM device according to the present invention will be described in detail, referring the accompanying drawings.

Figure 1A:
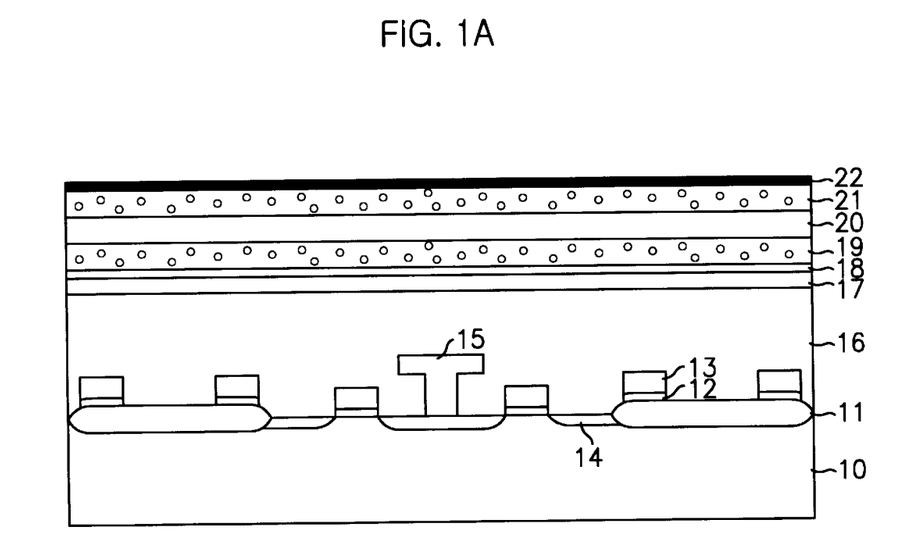
FIGS. 1A to 1I are cross-sectional views illustrating a method for manufacturing a FRAM device in accordance with an embodiment of the present invention.

First, referring to FIG. 1A, a gate oxide insulating layer 12, a gate electrode 13 and an active region 14 are formed on a Si substrate 10 in which filed oxide layers 11 are formed, thereby forming a transistor and a bit line 15. A first interlayer insulating layer 16, such as a BPSG (boro-phospho-silicate-glass) layer, is formed on the entire resultant structure and a medium temperature oxide layer 17 is formed on the first interlayer insulating layer 16. A Ti layer 18 for a lower electrode is formed on the medium temperature oxide layer 17 to a thickness of 50 to 500 Å and a first Pt layer 19 is formed on the Ti layer 18 to a thickness of 1000 to 3000 Å. At this time, the Ti layer 18 and the first Pt layer 19 are formed in the same chamber, i.e., in-situ processes without there being an exposure to air. Furthermore, after forming the first Pt layer 19, a thermal treatment is carried out at a temperature of approximately 400 to 900° C. in a furnace and for 10 minutes to 2 hours. This thermal treatment prevents Ti atoms in the Ti layer from being diffused into a ferroelectric layer in a capacitor of a FRAM device, by oxidizing the Ti layer 18 which is not reacted with the first Pt layer 19. After forming a ferroelectric layer 20, such as a $SrBi_2Ta_2O_9$ film, on the first Pt layer 19 using spin coating, LSMCD (liquid source mixed chemical deposition), CVD (chemical vapor deposition) or PVD (physical vapor deposition) method, a second Pt layer 21 and a TiN layer 22 are, in this order, formed on the ferroelectric layer 20 at a thickness of approximately 1000 to 3000 Å and 300 to 1000 Å respectively.

Figure 1B:
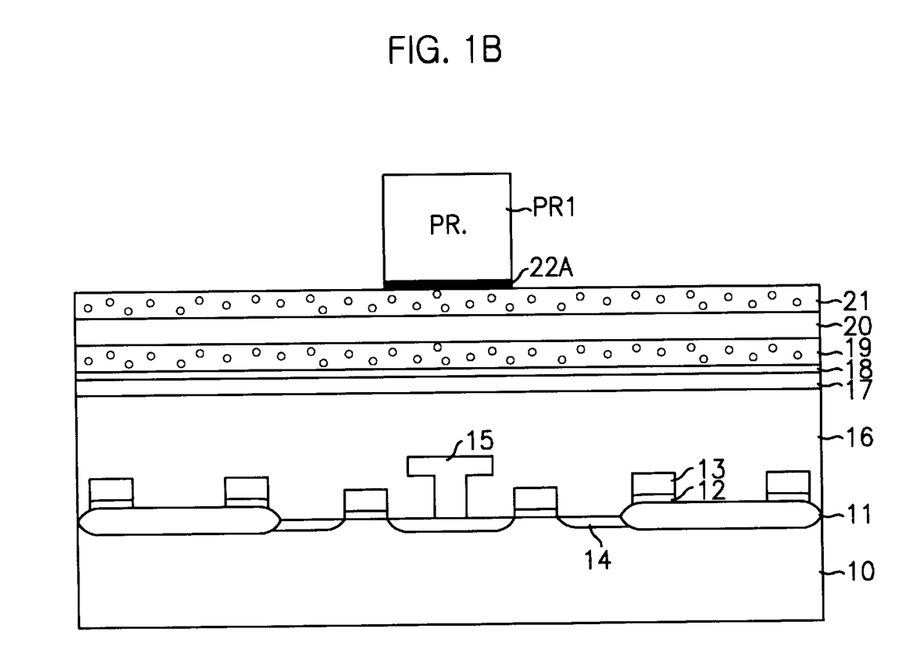

Next, referring to FIG. 1B, a first photoresist pattern PR1 is formed on the TiN layer 22 and a TiN pattern 22A is formed by etching the TiN layer 22 using the first photoresist pattern PR1 as an etching mask.

Figure 1C:
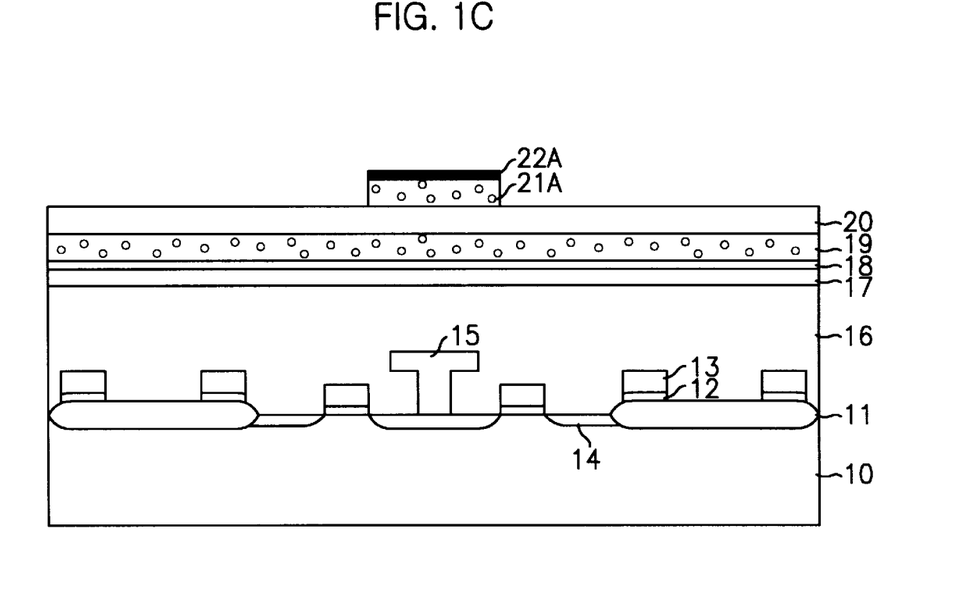

As shown in FIG. 1C, after removing the first photoresist pattern PR1, a Pt upper electrode 21A is formed by etching the second Pt layer 21 using the TiN pattern 22A as an etching barrier layer.

Figure 1D:
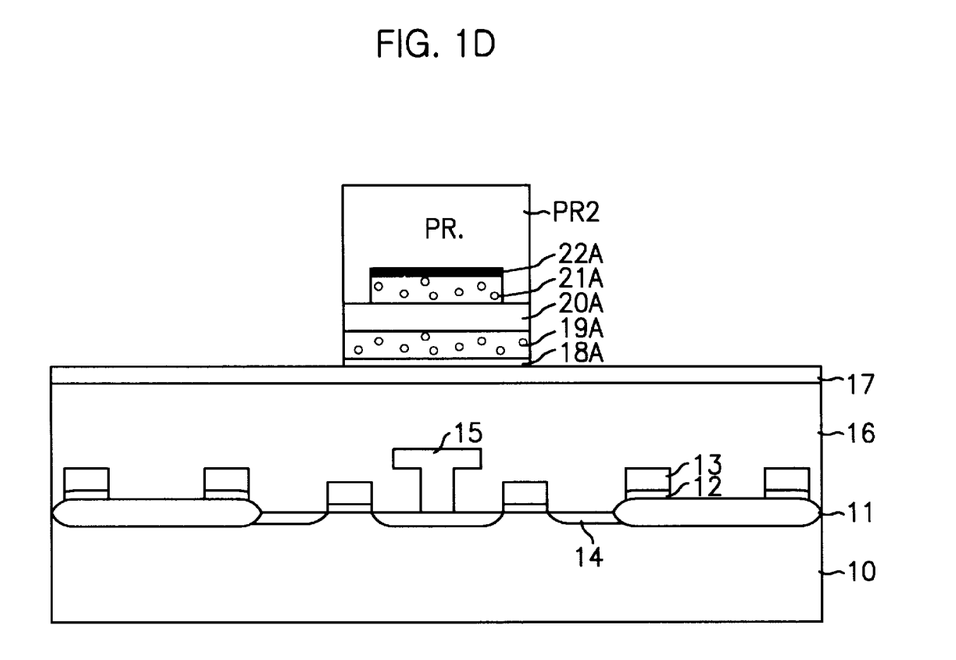

Subsequently, referring to FIG. 1D, a second photoresist pattern PR2 is formed on the resultant structure. The ferroelectric layer 20, the first Pt layer 19 and the Ti layer 18 are patterned using the second photoresist pattern PR2 as an etching mask, thereby forming a ferroelectric pattern 20A, a lower Pt electrode pattern 19A and a Ti pattern 18A.

Figure 1E:
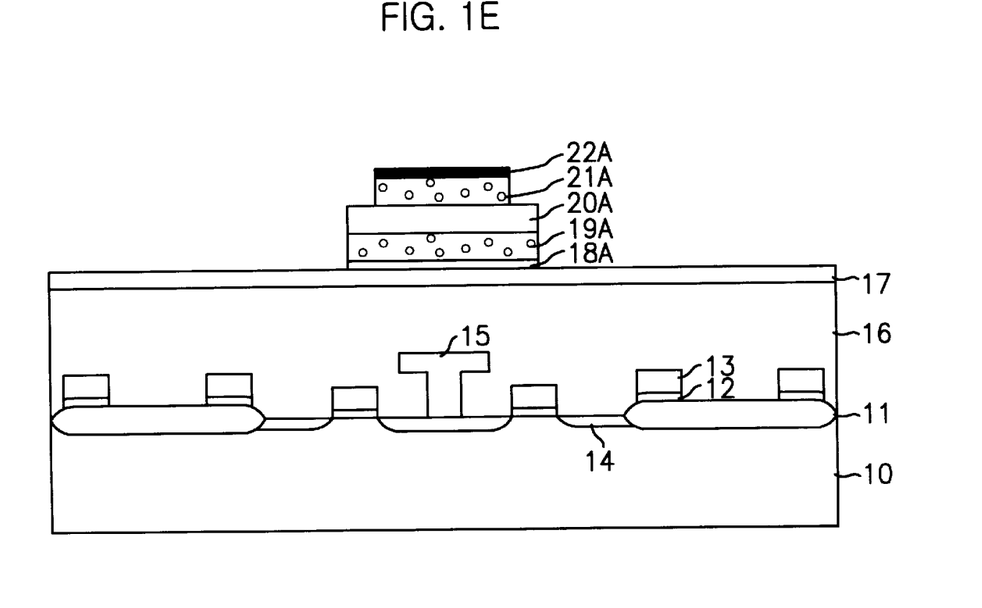

Referring to FIG. 1E, the second photoresist pattern PR2 is removed, but not the TiN pattern 22A. After removing the second photoresist pattern PR2, a thermal treatment is carried out at a temperature of approximately 400 to 900° C. for 10 minutes to 2 hours and in an inert gas atmosphere, such as $N_2$ or Ar gas. At this time, a rapid thermal treatment can be carried out for a short time and at a high temperature. This thermal treatment is performed to prevent the TiN pattern 22A from being oxidized at following process. The prevention of this oxidization makes it possible to serve the TiN pattern 22A as a diffusion barrier layer. In addition, this thermal treatment may recover the layers to which the etching processes to form patterns cause damage.

Figure 1F:
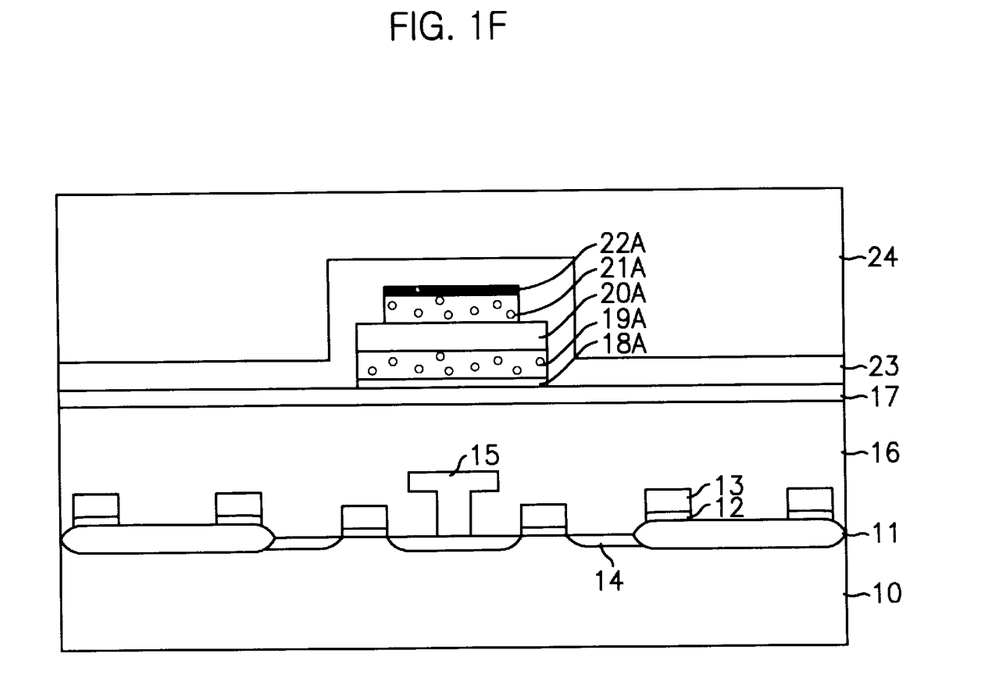

Referring to FIG. 1F, a capping oxide layer 23 for protecting the ferroelectric capacitor is formed on the entire resultant structure and, in the preferred embodiment, the capping oxide layer 23 is a TEOS (tetra-ethyl-ortho-silicate) layer. It should be noted that the capping oxide layer 23 covers the exposed surfaces of the TiN pattern 22A, the Pt upper electrode 21A, the ferroelectric pattern 20A, the lower Pt electrode pattern 19A and the Ti pattern 18A. A second interlayer oxide layer 24 for planarization is formed on the entire resultant structure.

Figure 1G:
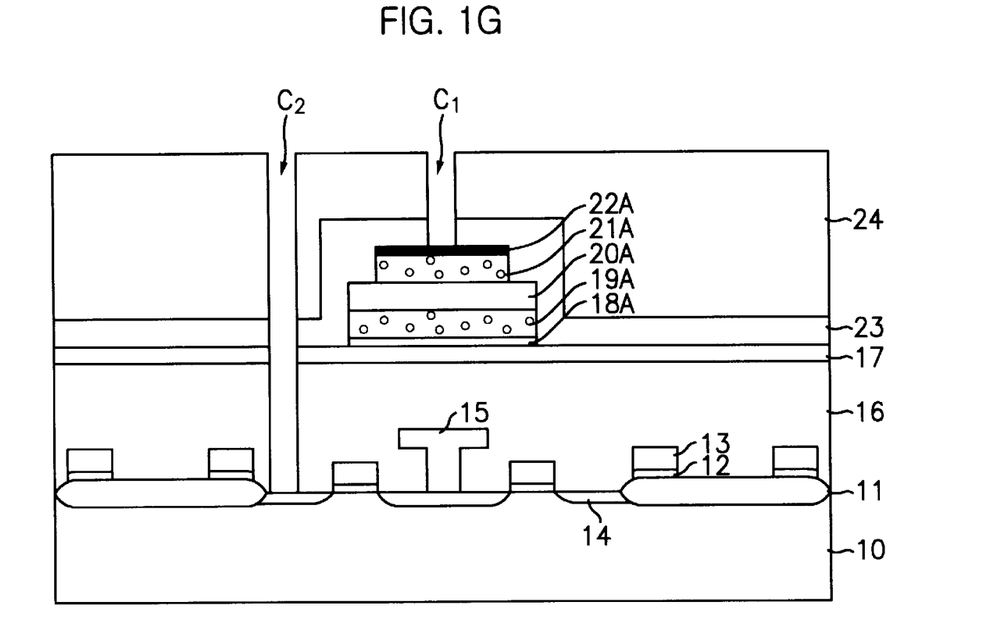

Referring to FIG. 1G, a first contact hole $C_1$ to expose a surface of the TiN pattern 22A is formed by selectively etching the second interlayer oxide layer 24 and the capping oxide layer 23 and a second contact hole $C_2$ to expose an active region of the transistor is formed by selectively etching the second interlayer oxide layer 24, the capping oxide layer 23, the medium temperature oxide layer 17 and the first interlayer insulating layer 16.

Figure 1H:
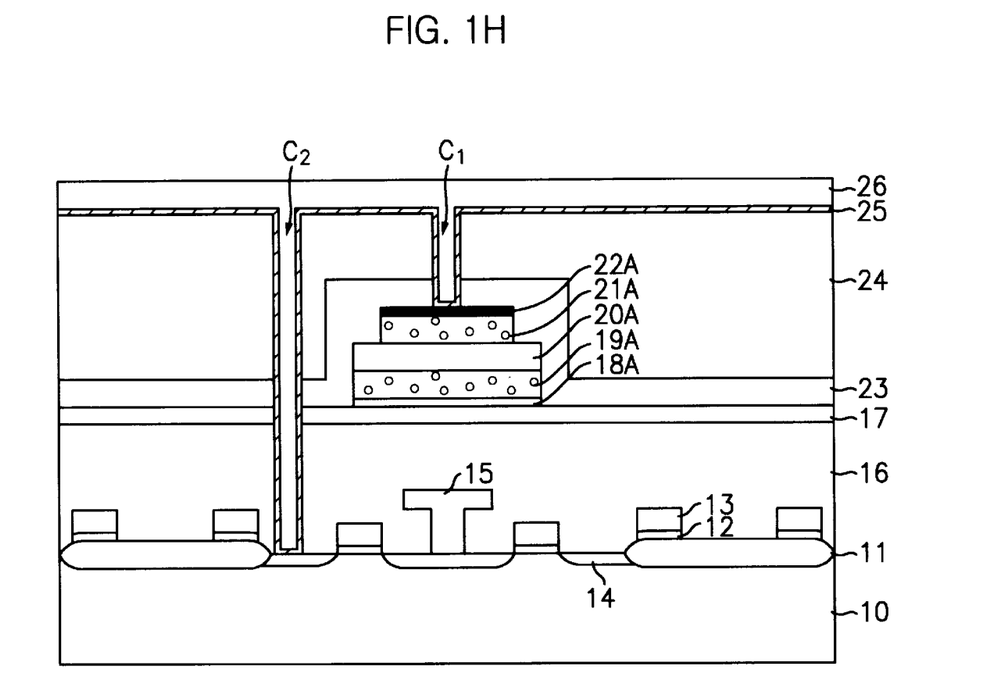

Referring to FIG. 1H, a TiN/Ti layer 25 is formed on the surfaces exposed through the first and second contact holes $C_1$ and $C_2$ and a metal layer 26, such as a W or Al layer, is formed on the TiN/Ti layer 25. The Ti layer from the TiN/Ti layer 25 improves adhesive strength between the metal layer 26 and the an underlying layer, such as the Si substrate 10 and an oxide layer, and the TiN layer from the TiN/Ti layer 25 functions as a diffusion barrier layer to prevent Si atoms in the Si substrate 10 from being diffused into the Ti layer.

Figure 1I:
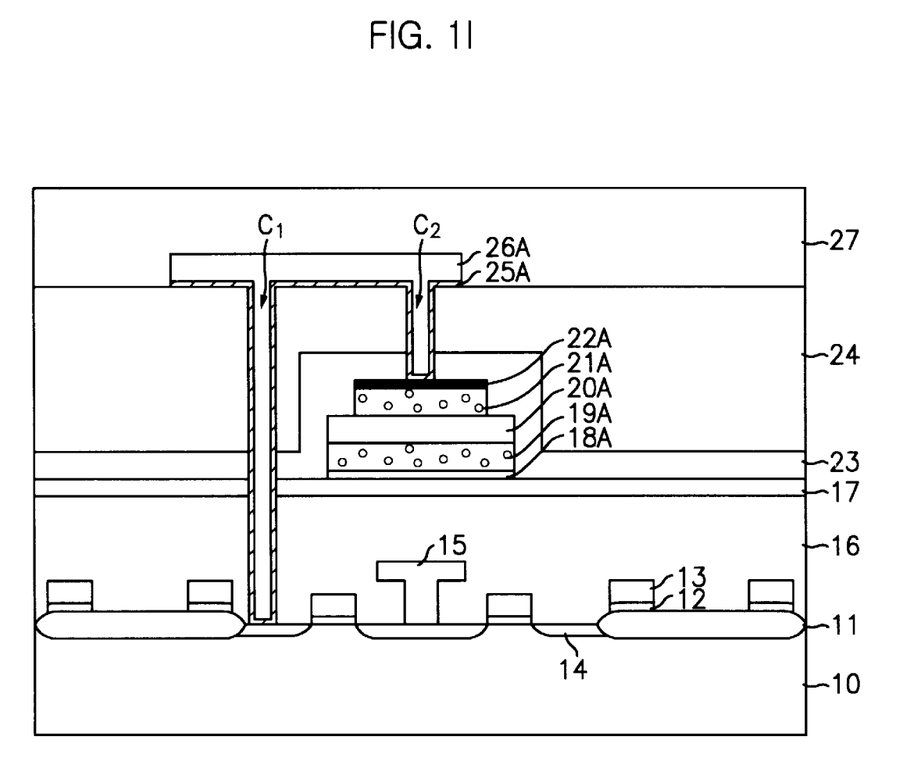

Finally, referring to FIG. 1I, the metal layer 26 is selectively etched to form a metal wire 26A connecting the active region of the transistor to the ferroelectric capacitor through the first and second contact holes C1 and C2 and a third interlayer insulating layer 27 is formed on the entire resultant structure.

As described above, because the Pt upper electrode 21A is formed using the TiN pattern 22A as an etching barrier layer, the polymer, which can be caused when a photoresist layer is used as an etching barrier layer, is prevented. Further, because the TiN pattern 22A is thermally treated at a high temperature and in $N_2$ or Ar atmosphere, the Ti atoms generating in the metal interconnection do not diffuse into the ferroelectric pattern 20A.

Figure 2A:
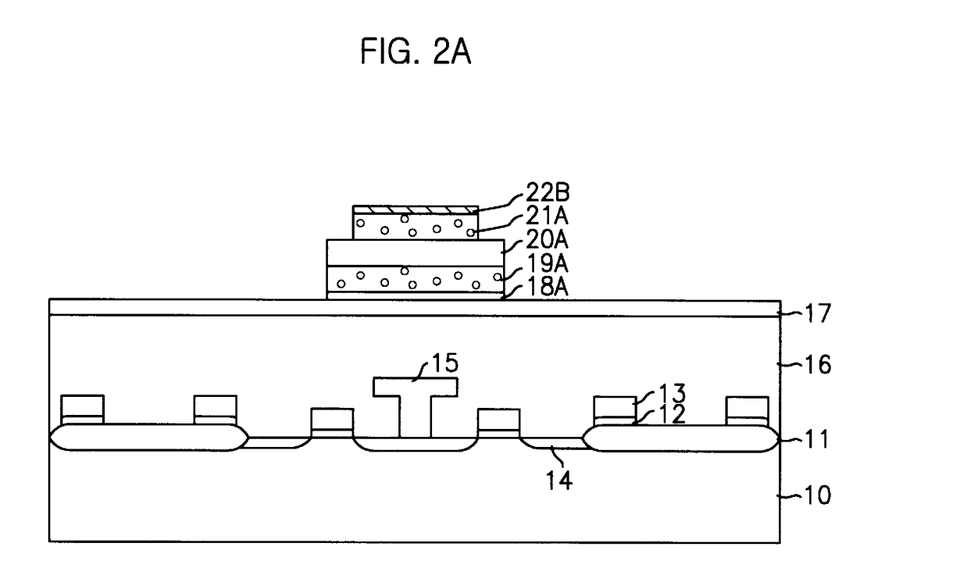
FIGS. 2A to 2C are cross-sectional views illustrating a method for manufacturing a FRAM device in accordance with another embodiment of the present invention.
Figure 2B:
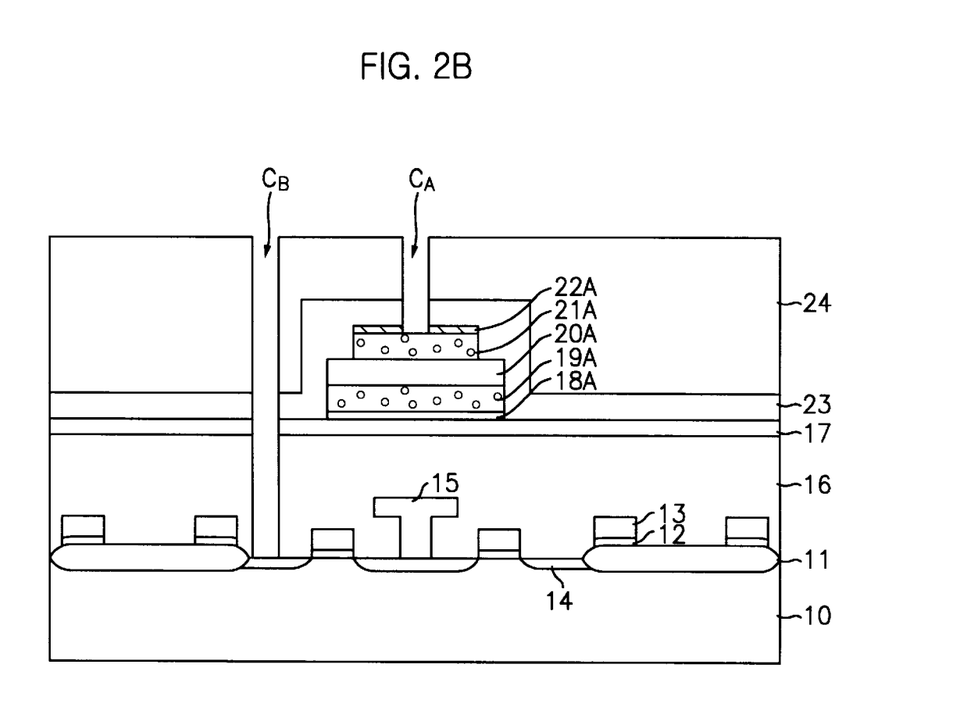
Figure 2C:
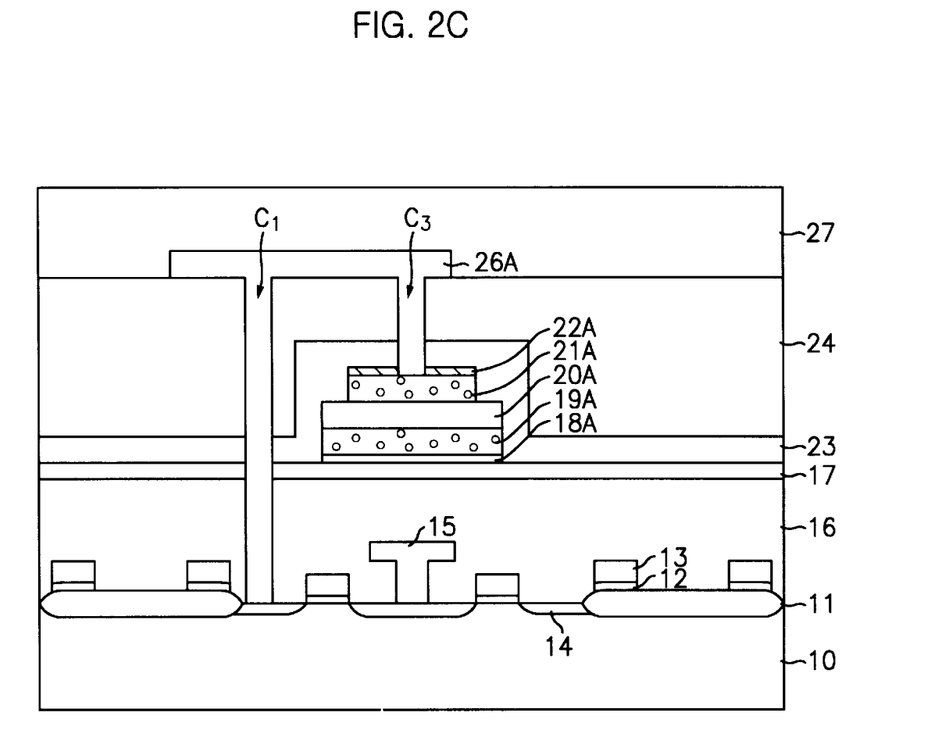

Another embodiment according to the present invention is shown in FIGS. 2A to 2C. First, elements denoted with the same reference numerals in FIGS. 1A to 1I are similar to the elements designated with that reference numerals in FIGS. 2A to 2C, and, therefore, are not described in detailed here.

The structure shown in FIG. 2A is the same as that in FIG. 1E, except for a $TiO_x$ (x: 1 to 2) pattern 22B. The $TiO_x$ pattern 22B is formed by transforming the phase of the TiN layer 22. That is, the RTP or the thermal treatment is applied to the TiN layer 22 in a furnace on the following conditions:

Temperature: 400 to 900°C.

Atmosphere: $O_2$

Time: 10 minutes to 2 hours

The formation of the $TiO_x$ pattern 22B further improves adhesive strength between the Pt upper electrode 21A and a protection oxide layer which is formed in a following process. Further, this thermal treatment in the $O_2$ atmosphere may recover the layers to which the etching processes to form patterns cause damage.

Referring to FIG. 2B, a capping oxide layer 23 for protecting the ferroelectric capacitor is formed on the entire resultant structure and, in the preferred embodiment, the capping oxide layer 23 is a TEOS (tetra-ethyl-ortho-silicate) layer. It should be noted that the capping oxide layer 23 covers the exposed surfaces of the $TiO_x$ pattern 22B, the Pt upper electrode 21A, the ferroelectric pattern 20A, the lower Pt electrode pattern 19A and the Ti pattern 18A. A second interlayer oxide layer 24 for planarization is formed on the entire resultant structure. A first contact hole $C_A$ to expose a surface of the Pt upper electrode 21A is formed by selectively etching the second interlayer oxide layer 24, the capping oxide layer 23 and the $TiO_x$ pattern 22B and a second contact hole $C_B$ to expose an active region of the transistor is formed by selectively etching the second interlayer oxide layer 24, the capping oxide layer 23, the medium temperature oxide layer 17 and the first interlayer insulating layer 16.

Referring to FIG. 2C, the first and second contact holes $C_A$ and $C_B$ are filled with a metal layer 26A which is the same as that shown in FIG. 1I and the third interlayer insulating layer 27 which is the same as that shown in FIG. 1I is formed on the entire resultant structure.

As apparent from above, the FRAM device according to the present invention prevents the polymer by using the TiN layer as an etching (or hard) mask and prevents the Ti atoms from being diffused into the ferroelectric layer by applying the thermal treatment to the TiN pattern on the Pt upper electrode. Furthermore, adhesive strength between the capping oxide layer and the Pt upper electrode is improved by the oxidation of the TiN pattern.

It will be apparent to those skilled in the art that various modifications and variations can be made in FRAM devices of the present invention without departing from the sprit or scope of the present invention. Thus, it is intended that the present invention covers the modifications and variations within the scope of appended claims and their equivalents.

What is claimed is:

1. A method for fabricating a FRAM device, comprising the steps of:
   a) forming a first interlayer insulating layer on a semiconductor device having a transistor;
   b) forming a first conducting layer, a ferroelectric layer and a second conducting layer on the first interlayer insulating layer;
   c) forming a TiN layer on the second conducting layer and forming a TiN pattern layer by selectively etching the TiN layer;
   d) forming an upper electrode by selectively etching the second conducting layer, wherein the second conducting layer is etched using the TiN pattern layer as an etching mask; and
   e) forming a capping oxide layer on the TiN layer.

2. The method in accordance with claim 1, wherein the method further comprises the step of applying a thermal treatment to the TiN pattern layer in $N_2$ or Ar atmosphere.

3. The method in accordance with claim 2, wherein the thermal is carried out at a temperature of 400 to 900° C.

4. The method in accordance with claim 3, wherein the thermal treatment is carried out for 10 minutes to 2 hours.

5. The method in accordance with claim 2, wherein the method further comprises the steps of:
   g) forming a second interlayer insulating layer on a resulting structure;
   h) forming a first contact hole to expose a portion of the TiN pattern layer by selectively etching the second interlayer insulating layer and the capping oxide layer and forming a second contact hole to expose an active region of the transistor by selectively etching the second interlayer insulating layer, the capping oxide layer and the first interlayer insulating in this order; and
   i) forming a metal wire for electrically connecting the active region to the upper electrode.

6. The method in accordance with claim 5, wherein the first and second conducting layers are Pt layers.

7. The method in accordance with claim 5, wherein the ferroelectric layer is a $SrBi_2Ta_2O_9$ ferroelectric layer.

8. A method for fabricating a FRAM device, comprising the steps of:
   a) forming a first interlayer insulating layer on a semiconductor device having a transistor;
   b) forming a first conducting layer, a ferroelectric layer and a second conducting layer on the first interlayer insulating layer;
   c) forming a TiN layer on the second conducting layer and forming a TiN pattern layer by selectively etching the TiN layer;
   d) forming an upper electrode by selectively etching the second conducting layer, wherein the second conducting layer is etched using the TiN pattern layer as an etching mask;
   e) forming ferroelectric pattern layer and a lower electrode by selectively etching the ferroelectric layer and the first conducting layer;
   f) transforming the TiN pattern layer to a $TiO_x$ (x is 1 to 2) pattern layer by applying thermal treatment to the TiN pattern layer; and
   g) forming a capping oxide layer covering an upper portion of the $TiO_x$ pattern layer and sidewalls of the $TiO_x$ pattern layer, the upper electrode, the ferroelectric pattern layer and the lower electrode.

9. The method in accordance with claim 8, wherein the step f) is carried out in an $O_2$ atmosphere.

10. The method in accordance with claim 8, wherein the thermal treatment is carried out at a temperature of 400 to 900° C.

11. The method in accordance with claim 9, wherein the thermal treatment is carried out for 10 minutes to 2 hours.

* * * * *

UNITED STATES PATENT AND TRADEMARK OFFICE
CERTIFICATE OF CORRECTION

PATENT NO. : 6,210,979 B1  Page 1 of 1
DATED : April 3, 2001
INVENTOR(S) : Kweon et al.

It is certified that error appears in the above-identified patent and that said Letters Patent is hereby corrected as shown below:

<u>Title page,</u>
Item [56], References Cited, U.S. PATENT DOCUMENTS, please insert the following references:
-- 5,777,356   7/7/98      Dhote et al.
5,382,817   1/17/95     Kashihara et al.
5,851,896   12/22/98    Summerfelt
5,696,018   12/9/97     Summerfelt et al.
5,585,300   12/17/96    Summerfelt
5,679,980   10/21/97    Summerfelt
5,619,393   4/8/97      Summerfelt et al.
5,489,548   2/6/96      Nishioka et al.
5,665,628   9/9/97      Summerfelt
5,554,564   9/10/96     Nishioka et al.
5,626,906   5/6/97      Summerfelt et al.
5,729,054   3/17/98     Summerfelt et al.
5,554,866   9/10/96     Nishioka et al.
5,576,928   11/19/96    Summerfelt et al.
5,589,284   12/31/96    Summerfelt et al.
5,566,045   10/15/96    Summerfelt et al.
5,504,041   4/2/96      Summerfelt
5,581,436   12/3/96     Summerfelt et al.
FOREIGN PATENT DOCUMENTS, please insert the following references:
2-183570    Japan
4-102367    Japan
2-186679    Japan
2-184079    Japan
3-212969    Japan
5-90606     Japan Signed and Sealed this Eighteenth Day of June, 2002

*Attest:*

JAMES E. ROGAN
*Attesting Officer*  *Director of the United States Patent and Trademark Office*